(12) United States Patent
Fischer et al.

(10) Patent No.: US 7,619,469 B2
(45) Date of Patent: Nov. 17, 2009

(54) CURRENT SWITCHED CIRCUIT FOR SWITCH MODE POWER AMPLIFIERS

(75) Inventors: Georg Fischer, Nuremberg (DE); Jeorg Huettner, Hof (DE)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 153 days.

(21) Appl. No.: 11/646,625

(22) Filed: Dec. 28, 2006

(65) Prior Publication Data

US 2008/0157872 A1 Jul. 3, 2008

(51) Int. Cl.
*H03F 3/217* (2006.01)
(52) U.S. Cl. .............. 330/251; 330/302; 330/207 A
(58) Field of Classification Search ............... 330/251, 330/207 A, 302
See application file for complete search history.

(56) References Cited

U.S. PATENT DOCUMENTS

| | | | | |
|---|---|---|---|---|
| 4,348,598 A * | 9/1982 | Smith | ............ | 327/579 |
| 4,533,863 A * | 8/1985 | Luhn et al. | ........... | 322/28 |
| 4,583,156 A * | 4/1986 | Forge | ............ | 363/17 |
| 4,868,445 A * | 9/1989 | Wand | ............ | 310/316.01 |
| 5,525,871 A | 6/1996 | Bray et al. | | |
| 6,396,250 B1 * | 5/2002 | Bridge | ............ | 323/283 |
| 6,417,737 B1 * | 7/2002 | Moloudi et al. | ............. | 330/301 |

OTHER PUBLICATIONS

Long, A. et al., "A 13W Current Mode Class D High Efficiency 1 GHz Power Amplifier," 45th IEEE Midwest Symp. Circ. Syst., Aug. 2002, downloaded from www.ece.ucsb/rad/pubs/conference/MWSCAS_2002.pdf on Dec. 26, 2006.

"Pulsewave rf: Class M Power Digital RF Amplifier", downloaded from http://www.pulsewaverf.com/technology_class_m_power.php on Dec. 26, 2006.

Tsai-Pi Hung, et al., "High Efficiency Current-Mode Class-D Amplifier with Integrated Resonator", Microwave Symposium Digest, vol. 3, Jun. 6, 2004.

Sergey Edward Lyshevski, et al., "Analysis, Dynamics, and Control of Micro-Electromechanical Systems", American Control Conference, vol. 5, Jun. 28, 2000.

PCT International Search Report corresponding to PCT Patent Application PCT/US2007/025902 filed Dec. 18, 2007 (4 pages).

PCT Written Opinion of the International Searching Authority corresponding to PCT Patent Application PCT/US2007/025902 filed Dec. 18, 2007 (7 pages).

* cited by examiner

*Primary Examiner*—Patricia Nguyen
(74) *Attorney, Agent, or Firm*—Harness, Dickey & Pierce, P.L.C.

(57) ABSTRACT

Disclosed is a switch mode power amplifier that provides high power (e.g., 100 W) at a high frequency (e.g., microwave frequency range). The switch mode power amplifier includes a load resistor, an inductor-capacitor (LC) circuit connected in parallel with the load resistor, a first switching mechanism connected to a first endpoint of the load resistor, and a second switching mechanism connected to a second endpoint of the load resistor. In one embodiment, the LC circuit is a first LC circuit connected in parallel with the load resistor and a second LC circuit is connected in series with the first LC circuit (and therefore connected in parallel with the load resistor). The circuit is transformer free.

19 Claims, 3 Drawing Sheets

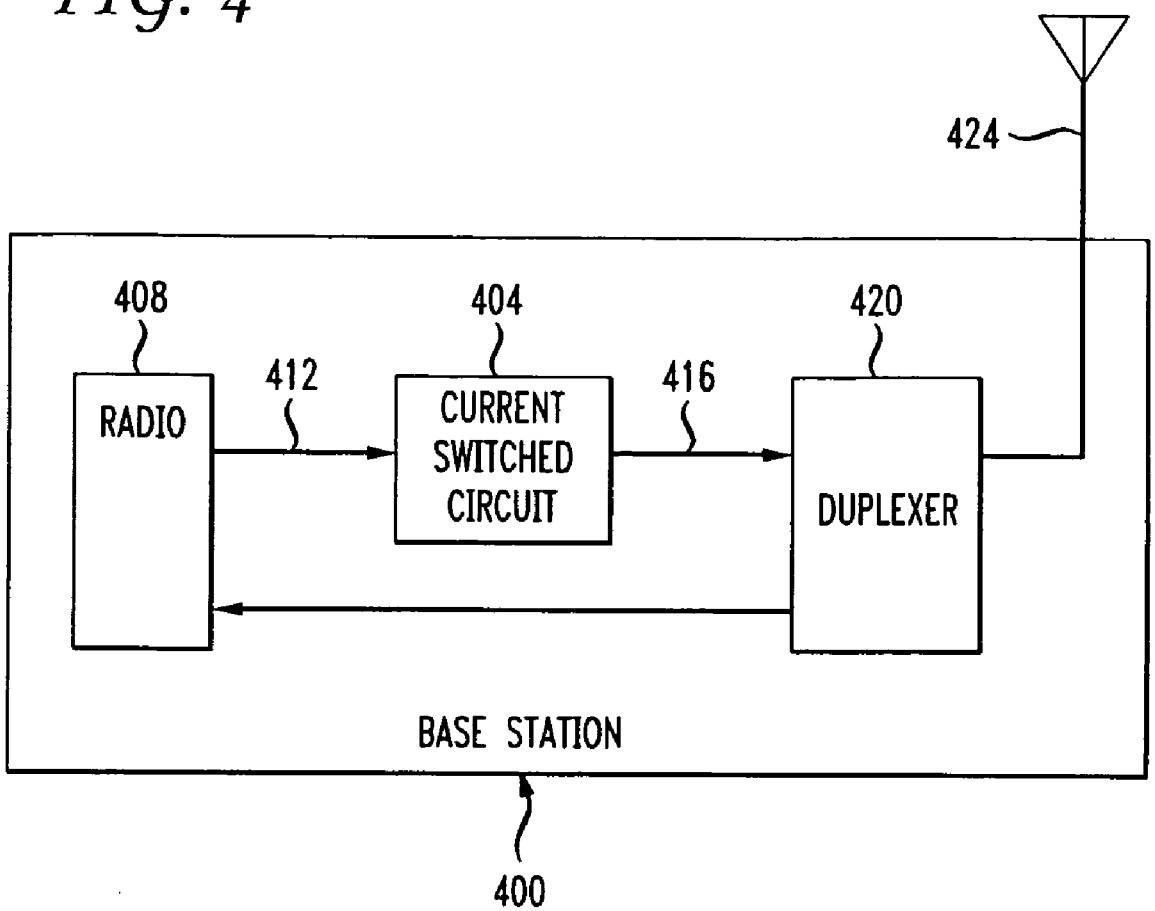

CURRENT SWITCHED CIRCUIT FOR SWITCH MODE POWER AMPLIFIERS

BACKGROUND OF THE INVENTION

The present invention relates generally to power amplifiers, and more specifically to switch mode power amplifiers.

Conventional series-regulated, linear power amplifiers typically maintain a constant voltage by varying their resistance to cope with input voltage changes or load current demand changes. These power amplifiers are used in, for example, cellular telephone base stations. Cellular telephone base stations typically consume a large amount of electricity in the process of amplifying signals sent to mobile handsets. As a result, a dominant fraction of the power that is input into the base station is typically dissipated as heat.

To deal with this heat dissipation, cooling fans and/or heat sinks are used so that the electrical components do not overheat. The cooling components often waste valuable space in the circuit cabinet and also consume additional power. For example, more than half of a base station may be occupied by amplifiers and their cooling components.

Switch mode power amplifiers, however, are typically more efficient than other types of power amplifiers. The switch mode power amplifier uses a high frequency switch (e.g., a transistor) with varying duty cycle to maintain an output voltage. The output voltage variations caused by the switching are often filtered out by an inductor-capacitor (LC) filter. Switch mode power amplifiers may operate in a Class-S (supply modulated) mode, which is a combination of a bandpass delta sigma modulator with a Class-D switching amplifier. Other modulators providing the drive switching signal for Class-D may also be implemented, such as a pulse length modulator.

The circuit topologies known to realize switch mode amplifiers are often used in audio applications (i.e., the switch mode amplifiers operate in the kHz frequency range). Recently, however, they have also been used in the microwave range (1-2 GHz), but the signals typically only produce a small amount of power (e.g., 2 W peak). Base stations, however, often need output signals having a peak power in the 100 W range. In the context of base stations, switched mode power amplifiers (e.g., class-S switched mode power amplifiers) are attractive because their high efficiency may enable the reduction of or elimination of cooling components (e.g., cooling fans and/or heat fins) and may lead to lower operational expenditure costs with the base station's operators. Thus, both capital expenditure (CAPEX) savings are present from less cooling effort and operational expenditure (OPEX) savings are present from less energy consumption.

Therefore, there remains a need to have a switch mode power amplifier that can be used in the microwave frequency range and also produce a power output that is an order of magnitude higher than is currently possible.

BRIEF SUMMARY OF THE INVENTION

In accordance with an aspect of the present invention, a switch mode power amplifier provides high power (e.g., 100 W) at a high frequency (e.g., microwave range). The switch mode power amplifier includes a load resistor, an inductor-capacitor (LC) circuit connected in parallel with the load resistor, a first switching mechanism connected to a first endpoint of the load resistor, and a second switching mechanism connected to a second endpoint of the load resistor. In one embodiment, the LC circuit is a first LC circuit connected in parallel with the load resistor and a second LC circuit is connected in series with the first LC circuit (and therefore connected in parallel with the load resistor).

The switch mode power amplifier can also include a choke, or inductor, connected in parallel to the first LC circuit and the second LC circuit. In one embodiment, the choke is connected to a voltage source that provides a voltage to the circuit. Alternatively, a current source provides a current to the circuit.

Examples of the switching mechanism include a transistor, a relay, a switch, and a nanoswitch. In one embodiment, if the switching mechanisms are transistors, each switching mechanism operates in its normal mode (e.g., the source to gate voltage is within a range such that the transistor can effectively act as a switch. For example, on a HEMT transistor, −6 V typically leads to an "off" state and +1V typically leads to an "on" state). The normal mode of the first switching mechanism and the second switching mechanism may be the same or may be different (e.g., different voltages for the two switching mechanisms are used for an "off" state and an "on" state). One or more of the switching mechanisms may also be a bipolar device (with an emitter, collector, and base).

In one embodiment, a balun is used to translate a balanced output of the circuit to a single ended output.

In another aspect of the present invention, a base station includes an antenna configured to transmit and receive communication signals, a radio configured to generate the communication signals, and a switch mode power amplifier as described above. The base station may also include a duplexer connected to the antenna and the switch mode power amplifier and configured to combine communication signals into a single path before transmitting the communication signals to the antenna for transmission.

These and other advantages of the invention will be apparent to those of ordinary skill in the art by reference to the following detailed description and the accompanying drawings.

BRIEF DESCRIPTION OF THE DRAWINGS

FIG. 4 is a high level block diagram of a base station using the current switch circuit of FIG. 3 in accordance with an embodiment of the present invention.

DETAILED DESCRIPTION

A voltage switched circuit topology of a switch mode power amplifier and a current switched circuit topology of a switch mode power amplifier are both well-known to one of ordinary skill in the art. Both circuit topologies, however, have their drawbacks.

Figure 1:
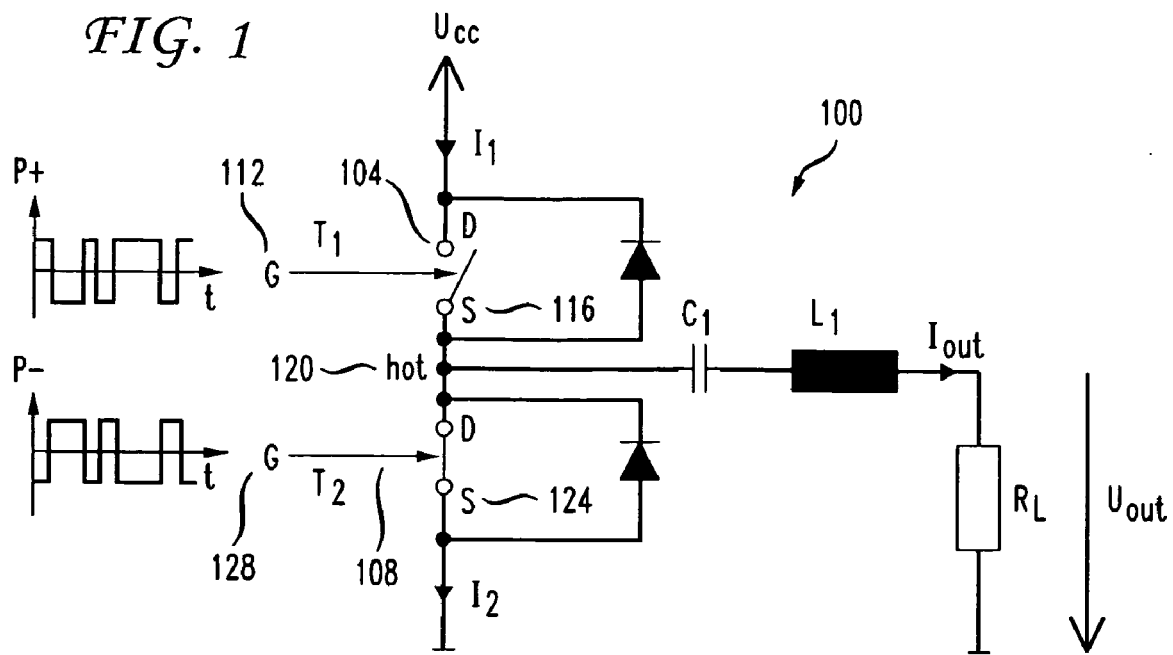
FIG. 1 is a circuit diagram of an exemplary voltage switched circuit.

FIG. 1 shows a prior art amplifier 100 based on voltage switched circuit topology. The voltage switched circuit 100 includes a first transistor 104 and a second transistor 108. The gate G 112 of the first transistor 104 is driven with reference to the source S 116 of the first transistor 104. The source S 116 of the first transistor 104 is "floating" and can swing between ground and the potential source (e.g., 48 V). This floating point, labeled the "hot" point 120, typically results in a voltage swing outside the range needed between the gate G 112 and the source S 116 (e.g., the gate G 112 to source S 116 voltage needs to be approximately 6 V and the 48 V range is outside a 6 V range).

With respect to the second transistor 108, the source S 124 is connected to ground and the gate G 128 is connected to a predetermined voltage (e.g., −5 V). As a result, the voltage between the source S 124 and the gate G 128 is within the normal operating range of the transistor. Thus, although the second transistor 108 can operate within its normal operating range in the voltage switched circuit 100, the hot point 120 causes the first transistor 104 to not be able to operate within its normal operating range (i.e., the gate G 112 is not easily driven because of its reference to hot point 120).

Figure 2:
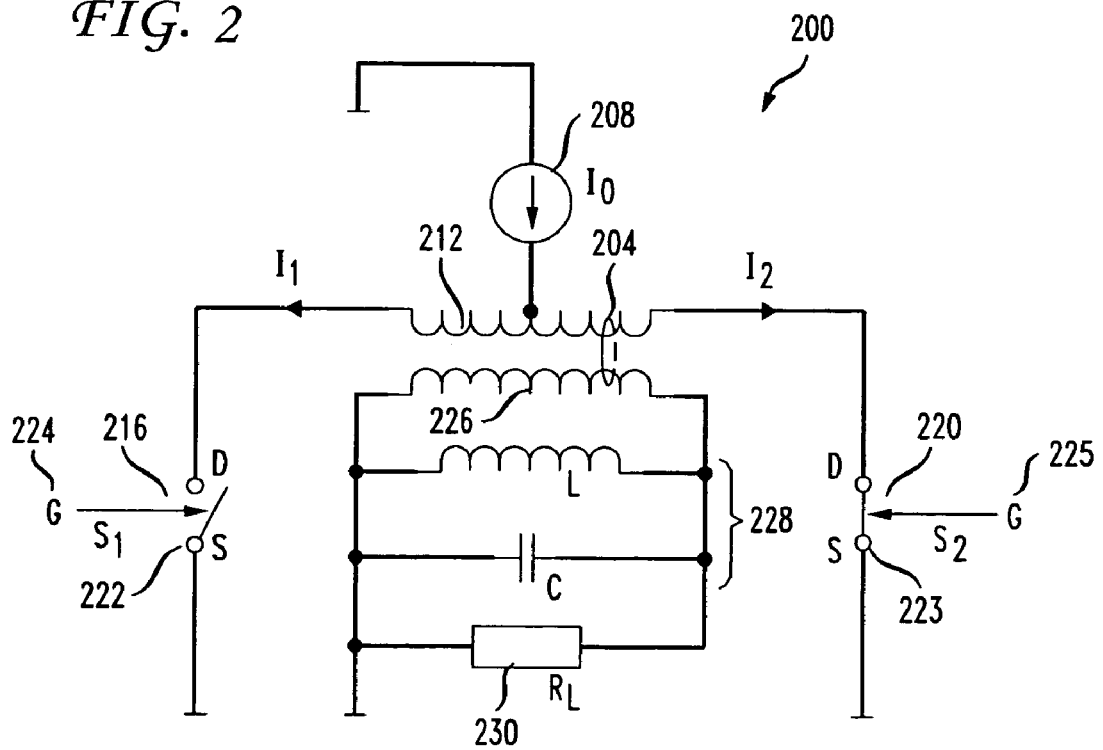
FIG. 2 is a circuit diagram of an exemplary current switched circuit.

To solve some of these problems, a current switched circuit may instead be used. FIG. 2 is a prior art power amplifier 200 based on the current switched circuit topology that includes transformer 204. A current source 208 inputs a current $I_0$ into the transformer 204 (i.e., primary coil 212 of the transformer 204). The current $I_0$ is split into a first current $I_1$ and a second current $I_2$. The first and second currents are respective inputs to a first and second transistor 216, 220, respectively. The source S 222, 223 of each respective transistor 216, 220 is connected to ground. Further, as gate G 224, 225 of each respective transistor 216, 220 is referenced to the respective source S 222, 223, each gate G 224, 225 is not a "floating" point and instead can be driven because the source to gate voltage swing is within each transistor's normal operating range. Further, the circuit 200 is symmetric and therefore ensures that 0s and 1s are typically treated identically. Also, the two drive signals are out of phase with one another (i.e., antiphase).

The two outputs of secondary coil 226 of the transformer 204 are in communication with a capacitor-inductor (LC) circuit 228. The LC circuit 228 is connected in parallel with a load resistor $R_L$ 230 (e.g., a speaker on audio or an antenna at microwave).

Circuit 200 has several drawbacks. First, transformers cannot typically operate in the microwave frequency range (at high power). Therefore, circuit 200 is not feasible for high power radio frequency (RF) signals in the microwave range because of the transformer 204. Additionally, current sources such as current source 208 are more difficult to produce than voltage sources such as the voltage source used in circuit 100.

Figure 3:
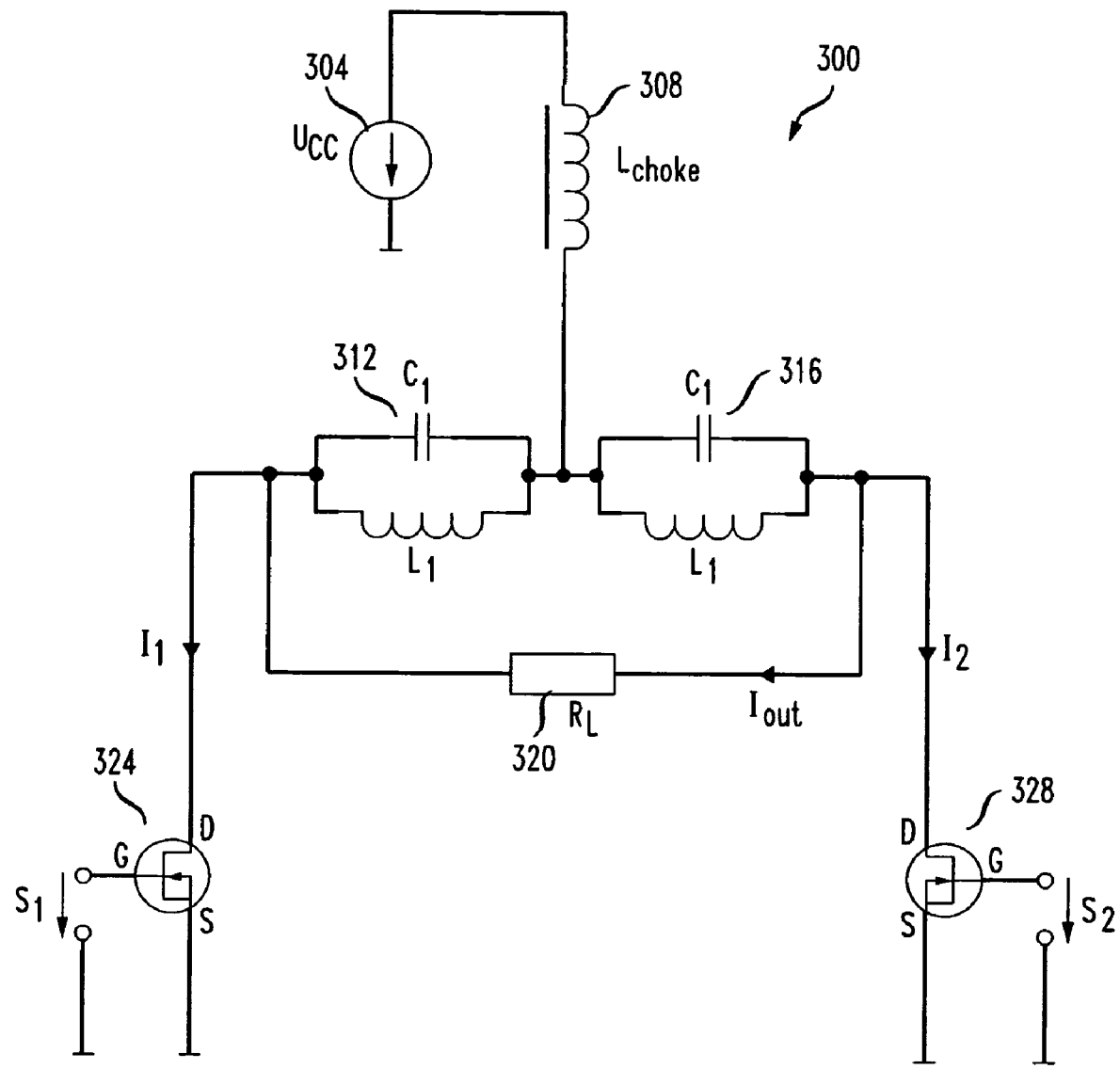
FIG. 3 is a circuit diagram of a current switched circuit in accordance with an embodiment of the present invention.

FIG. 3 shows a circuit diagram of a current switched circuit 300 in accordance with an embodiment of the present invention. This circuit 300 does not use a transformer, thereby enabling the use of class-S amplifier technology in the microwave frequency range.

The circuit 300 includes a power supply Vcc 304 in communication with an inductor, or RF choke, 308. The inductor 308 is typically used to facilitate the maintenance of a constant current flow in the circuit 300. The resonant inductor-capacitor (LC) circuit 228 of circuit 200, which is located at the output side of transformer 204, is translated to the input side and split into two resonant LC circuits 312, 316. These LC circuits 312, 316 include two capacitors that are each in parallel to a respective inductor. The LC circuits 312, 316 are in communication with a load resistor $R_L$ 320. In one embodiment, the LC circuits 312, 316 are used for filtering purposes. By splitting the LC circuit 228 shown in FIG. 2 into two LC circuits 312, 316 (of identical resonance frequency), a transformer is no longer needed because a rectangular signal is not being used in the circuit 300 but rather a fundamental sine signal is used. As this only covers one frequency without harmonics, techniques for translating from a balanced to a single ended output can be used. For example, a classical balun based on specific line lengths may be used for this.

The output current $I_1$ of the first LC circuit 312 and the output current $I_2$ of the second LC circuit 316 are in antiphase and input into separate transistors 324, 328, respectively, for, e.g., amplification purposes. In this circuit design, the transistors can be driven appropriately because there is no hot point like the hot point 120 shown in FIG. 1. In circuit 300, each source S of each transistor 324, 328 is connected to ground and each gate G is referenced to the respective source S.

In one embodiment, the current switched circuit 300 is used in a base station. FIG. 4 is a high level block diagram of a base station 400 including the current switched circuit (shown here as current switched circuit 404) described in FIG. 3. The base station 400 includes a radio 408 configured to generate communication signals that are transmitted by the basestation 400 (e.g., to a mobile device) and to analyze communication signals received by the basestation 400 (e.g., from a mobile device). Signals 412 generated by the radio 408 are transmitted to a switch mode power amplifier which is the current switched circuit 404 described above (in FIG. 3). The current switched circuit 404 then transmits signal 416 to duplexer 420 for communication to antenna 424 for transmission.

The current switched circuit 404 may reduce costs and lead to significant form factor reductions of the base station 400. In one embodiment, the use of the current switched circuit 404 can enable the base station 400 to be constructed much more densely than typically possible. Further, integrated transceivers (where the radio 408 and amplifier 404 are integrated in a compact unit) may be feasible. This may reduce the number of modules (i.e., Maintenance Replaceable Units (MRUs)/Comcodes) that an individual who is going to upgrade a base station has to use or carry in order to perform the upgrade.

Additionally, power consumption of base stations may be reduced when the circuit 300 is used in a base station's design because the power amplifiers consume a large percentage of the power that the base station consumes. This power consumption savings may increase the battery life of, for example, base station routers (BSRs).

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A switch mode power amplifier comprising:
    a load resistor;
    an inductor-capacitor circuit connected in parallel with said load resistor;
    a first switching mechanism connected to a first endpoint of said load resistor;
    a second switching mechanism connected to a second endpoint of said load resistor; and
    wherein said load inductor-capacitor circuit further comprises a first inductor-capacitor circuit connected in parallel with said load resistor and a second inductor-capacitor circuit connected in series with said first inductor-capacitor circuit.

2. The switch mode power amplifier of claim 1 further comprising an inductor connected in parallel to said first inductor-capacitor circuit and said second inductor-capacitor circuit.

3. The switch mode power amplifier of claim 1 wherein at least one of said first switching mechanism and said second switching mechanism is at least one of a transistor and a bipolar device.

4. The switch mode power amplifier of claim 3 wherein said first switching mechanism operates in a first state or a second state, said first state being an "on" state and said second state being an "off" state.

5. The switch mode power amplifier of claim 4 wherein said second switching mechanism operates in a first state or a second state, said first state being an "on" state and said second state being an "off" state.

6. The switch mode power amplifier of claim 2 further comprising a voltage source connected in series with said inductor and configured to provide a current.

7. The switch mode power amplifier of claim 1 further comprising a current source connected to said inductor-capacitor circuit.

8. The switch mode power amplifier of claim 1 wherein at least one of said first switching mechanism and said second switching mechanism is a nanoswitch.

9. The switch mode power amplifier of claim 1 further comprising a balun configured to translate a balanced output to a single ended output.

10. A base station comprising:
an antenna configured to transmit and receive communication signals;
a radio configured to generate said communication signals; and
a switch mode power amplifier connected to said radio and said antenna, said switch mode power amplifier comprising:
a load resistor,
an inductor-capacitor circuit connected in parallel with said load resistor,
a first switching mechanism connected to a first endpoint of said load resistor, and
a second switching mechanism connected to a second endpoint of said load resistor,
wherein said inductor-capacitor circuit further comprises a first inductor-capacitor circuit connected in parallel with said load resistor and a second inductor-capacitor circuit connected in series with said first inductor-capacitor circuit.

11. The base station of claim 10 further comprising a duplexer in communication with said antenna and said switch mode power amplifier and configured to combine communication signals into a single signal path before transmitting said communication signals to said antenna for transmission.

12. The base station of claim 10 further comprising an inductor connected in parallel to said first inductor-capacitor circuit and said second inductor-capacitor circuit.

13. The base station of claim 10 wherein at least one of said first switching mechanism and said second switching mechanism is at least one of a transistor and a bipolar device.

14. The base station of claim 13 wherein said first switching mechanism operates in a first state or a second state, said first state being an "on" state and said second state being an "off" state.

15. The base station of claim 14 wherein said second switching mechanism operates in a first state or a second state, said first state being an "on" state and said second state being an "off" state.

16. The base station of claim 10 further comprising a voltage source connected in series with said inductor and configured to provide a current.

17. The base station of claim 10 further comprising a current source connected to said inductor-capacitor circuit.

18. The base station of claim 10 wherein at least one of said first switching mechanism and said second switching mechanism is a nanoswitch.

19. The base station of claim 10 further comprising a balun configured to translate a balanced output to a single ended output.

* * * * *